US008358362B2

(12) United States Patent
Sato

(10) Patent No.: US 8,358,362 B2
(45) Date of Patent: Jan. 22, 2013

(54) SOLID-STATE IMAGING DEVICE, IMAGING APPARATUS, AND METHOD OF DRIVING THE SOLID-STATE IMAGING DEVICE

(75) Inventor: Kimihiko Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 250 days.

(21) Appl. No.: 12/762,050

(22) Filed: Apr. 16, 2010

(65) Prior Publication Data

US 2010/0271535 A1    Oct. 28, 2010

(30) Foreign Application Priority Data

Apr. 24, 2009    (JP) ................................ 2009-105821

(51) Int. Cl.
*H04N 5/335*  (2011.01)
(52) U.S. Cl. ........................................ 348/308; 348/294
(58) Field of Classification Search .................. 348/308, 348/294, 340
See application file for complete search history.

(56) References Cited

U.S. PATENT DOCUMENTS

| 2007/0070230 A1* | 3/2007 | Takahashi ..................... 348/308 |
| 2010/0177205 A1* | 7/2010 | Shimoda et al. ............ 348/222.1 |
| 2010/0194946 A1* | 8/2010 | Shinohara et al. ............ 348/300 |

FOREIGN PATENT DOCUMENTS

| JP | 2003-264281 | 9/2003 |
| JP | 2003-273342 | 9/2003 |

* cited by examiner

*Primary Examiner* — Tuan Ho
(74) *Attorney, Agent, or Firm* — SNR Denton US LLP

(57) ABSTRACT

A solid-state imaging device includes: a semiconductor substrate; plural photoelectric conversion units formed side by side on the semiconductor substrate to form a light receiving unit; a peripheral circuit formed in a portion on an outside of the light receiving unit on the semiconductor substrate; a wiring section formed on the light receiving unit and formed for connecting the plural photoelectric conversion units and the peripheral circuit; and a dummy wiring section formed on an opposite side of the wiring section for at least one photoelectric conversion unit among the plural photoelectric conversion units on the light receiving unit and formed for functioning as a non-connected wiring section not connected to the photoelectric conversion units and the peripheral circuit, wherein the dummy wiring section has a predetermined potential.

11 Claims, 8 Drawing Sheets

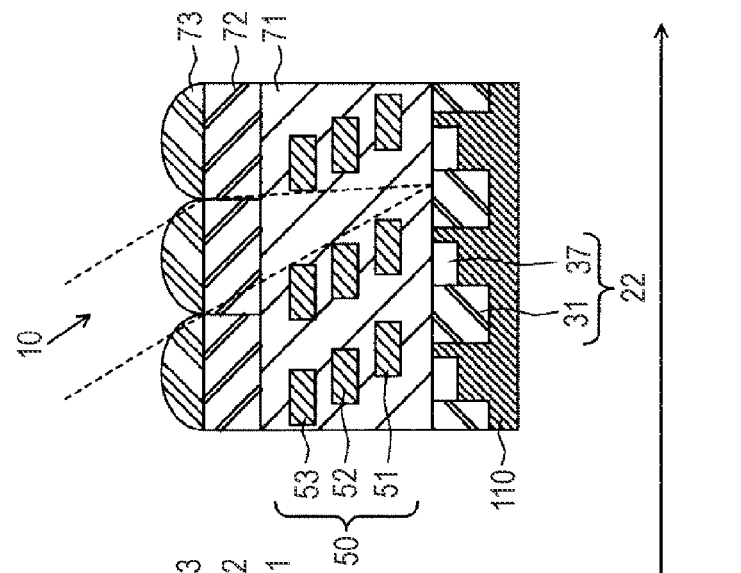
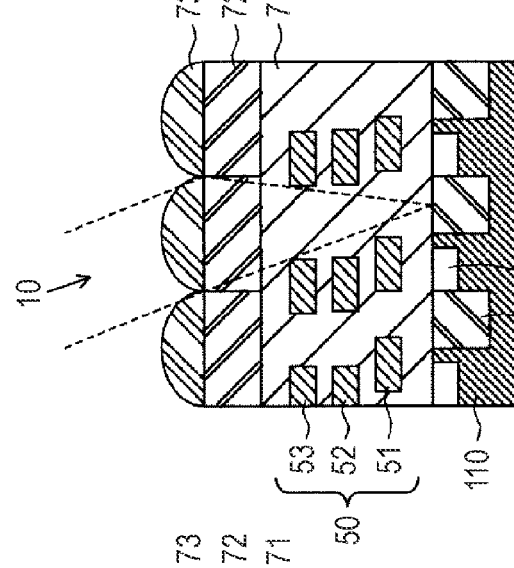
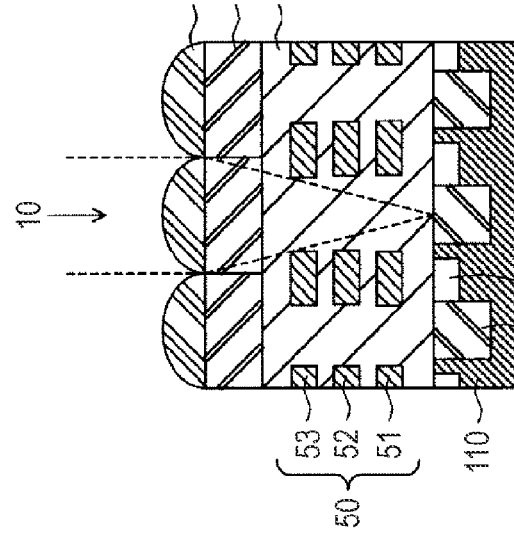

SOLID-STATE IMAGING DEVICE, IMAGING APPARATUS, AND METHOD OF DRIVING THE SOLID-STATE IMAGING DEVICE

BACKGROUND OF THE INVENTION

1. Field of the Invention

The present invention relates to a solid-state imaging device that has plural photoelectric conversion units in a pixel unit and generates an output signal corresponding to light reception of the plural photoelectric conversion units, an imaging apparatus, and a method of driving the solid-state imaging device.

2. Description of the Related Art

JP-A-2003-273342 and JP-A-2003-264281 disclose solid-state imaging devices.

In each of the solid state imaging devices, plural photoelectric conversion units are formed side by side on one surface of a semiconductor substrate to form a light receiving unit on the semiconductor substrate.

Plural wiring sections are formed between adjacent two photoelectric conversion units on the light receiving unit. The photoelectric conversion units receive light that has passed between the wiring sections formed on both sides of the photoelectric conversion units.

SUMMARY OF THE INVENTION

However, when the wiring sections, gates, and the like are formed on the light receiving unit, in some case, the wiring sections affect photoelectric conversion characteristics of the photoelectric conversion units.

For example, depending on the potentials of the wiring sections, the photoelectric conversion characteristics change because of the potentials and a dark signal component in an output signal generated by solid-state imaging device increases.

Further, in some case, an image defect such as white void occurs in an image picked up by using the solid-state imaging device.

A degree of the influence on the photoelectric conversion characteristics due to the wiring sections formed on the light receiving unit is different according to the potentials of the wiring sections, the gates, and the like.

In a solid-state imaging device actually manufactured, in some case, a dummy wiring section is provided such that wiring sections formed on a light receiving unit are optically symmetrically arranged with respect to photoelectric conversion units.

The dummy wiring section formed to improve an optical characteristic in this way is formed in, for example, a position on the opposite side of the wiring sections with respect to the photoelectric conversion units.

For example, when the wiring sections are formed on the right side of one photoelectric conversion unit, the dummy wiring section is formed on the left side of the photoelectric conversion unit.

Consequently, light made incident on the photoelectric conversion unit from above can be made incident on the photoelectric conversion unit as light optically having symmetry.

When the dummy wiring section is provided in the solid-state imaging device, like the other wiring sections, the dummy wiring section is likely to affect photoelectric conversion characteristics of the photoelectric conversion units.

However, the dummy wiring section is a wiring section for making the wiring sections on both sides of the photoelectric conversion units optically symmetrical.

Therefore, the dummy wiring section is not connected to the other wiring sections by via contacts or the like.

This makes the potential of the dummy wiring section unstable.

Therefore, it is difficult to predict a degree of the influence of the dummy wiring section on the photoelectric conversion characteristics of the photoelectric conversion units.

It is difficult to remove, with signal processing or the like, the actual influence of the dummy wiring section on the photoelectric conversion characteristics of the photoelectric conversion units.

Therefore, in the solid-state imaging device, the imaging apparatus, and the method of driving the solid-stage imaging device, it is desired to suppress the influence of the dummy wiring section, which is formed to improve the optical characteristic, on the photoelectric conversion characteristics of the photoelectric conversion units and make a degree of the influence predictable to the same degree as the influence of the other wiring sections.

According to one embodiment of the present invention, there is provided a solid-state imaging device including: a semiconductor substrate; plural photoelectric conversion units formed side by side on the semiconductor substrate to form a light receiving unit; a peripheral circuit formed in a portion on the outside of the light receiving unit on the semiconductor substrate; a wiring section formed on the light receiving unit and formed for connecting the plural photoelectric conversion units and the peripheral circuit; and a dummy wiring section formed on the opposite side of the wiring section for at least one photoelectric conversion unit among the plural photoelectric conversion units on the light receiving unit and formed for functioning as a non-connected wiring section not connected to the photoelectric conversion units and the peripheral circuit. The dummy wiring section has a predetermined potential.

According to another embodiment of the present invention, there is provided an imaging apparatus including: an optical unit that condenses light; and a solid-state imaging device that receives the light condensed by the optical unit. The solid-state imaging device includes: a semiconductor substrate; plural photoelectric conversion units formed side by side on the semiconductor substrate to form a light receiving unit; a peripheral circuit formed in a portion on the outside of the light receiving unit on the semiconductor substrate; a wiring section formed on the light receiving unit and formed for connecting the plural photoelectric conversion units and the peripheral circuit; and a dummy wiring section formed on the opposite side of the wiring section for at least one photoelectric conversion unit among the plural photoelectric conversion units on the light receiving unit and formed for functioning as a non-connected wiring section not connected to the photoelectric conversion units and the peripheral circuit. The dummy wiring section has a predetermined potential.

According to still another embodiment of the present invention, there is provided a method of driving a solid-state imaging device including: a wiring section formed on a light receiving unit formed by plural photoelectric conversion units formed side by side on a semiconductor substrate on which a peripheral circuit is formed, the wiring section being formed for connecting the plural photoelectric conversion units and the peripheral circuit; and a dummy wiring section formed on the opposite side of the wiring section with respect to the photoelectric conversion units on the light receiving unit and formed for functioning as non-connected wiring section not connected to the photoelectric conversion units and the peripheral circuit.

The method of driving a solid-state imaging device includes the steps of: receiving light using the solid-state imaging device; and generating an output signal corresponding to light reception of the plural photoelectric conversion units of the solid-state imaging device. In the light receiving step, the light is received in a state in which the wiring section and the dummy wiring section have a predetermined potential.

In the first embodiment, the dummy wiring section formed to improve the optical characteristic has the predetermined potential.

According to the embodiments, it is possible to suppress the actual influence of the dummy wiring section, which is formed to improve the optical characteristic, on photoelectric conversion characteristics of the photoelectric conversion units.

According to the embodiments, it is possible to make a degree of the actual influence of the dummy wiring section on the photoelectric conversion characteristics of the photoelectric conversion units predictable to the same degree as the influence of the other wiring sections.

BRIEF DESCRIPTION OF THE DRAWINGS

FIGS. 5A to 5C are schematic partial sectional views of a pixel unit of the solid-state imaging device shown in FIG. 2;

DESCRIPTION OF THE PREFERRED EMBODIMENTS

Embodiments of the present invention are explained below with reference to the accompanying drawings. The explanation is made in the following order.

1. First embodiment (an example in which potential same as that of wiring sections in optically symmetrical positions is applied to a dummy wiring section)

2. Second embodiment (an example in which potential different from that of wiring sections in optically symmetrical positions is applied to a dummy wiring section).

First Embodiment

Configuration of an Imaging Apparatus 1

Figure 1:
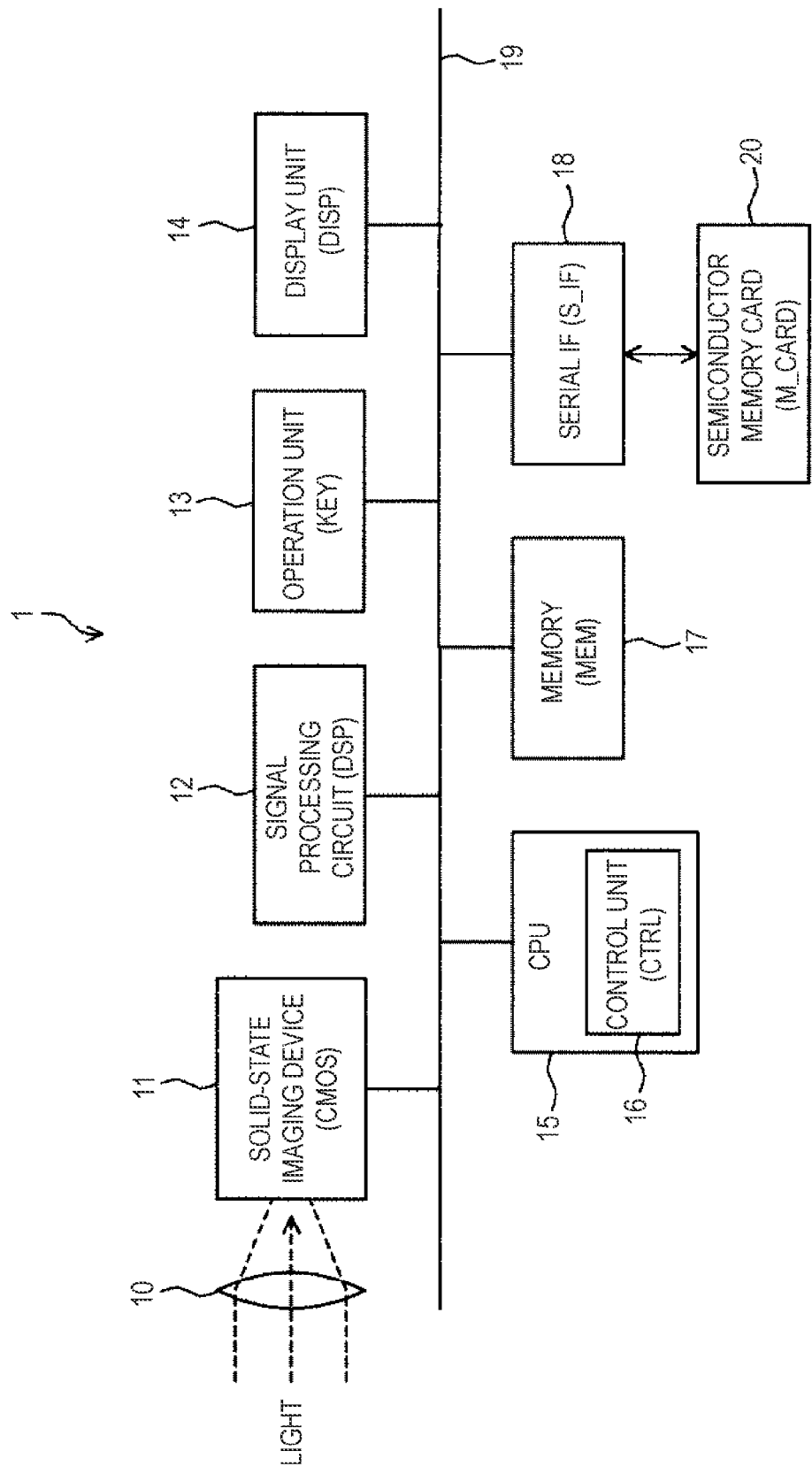
FIG. 1 is a block diagram of an imaging apparatus according to a first embodiment of the present invention.

FIG. 1 is a block diagram of an imaging apparatus 1 according to an embodiment of the present invention.

The imaging apparatus 1 includes an optical unit 10, a solid-state imaging device (CMOS) 11, a signal processing circuit (DSP) 12, an operation unit (KEY) 13, and a display unit (DISP) 14.

Further, the imaging apparatus 1 includes a CPU (Central Processing Unit) 15, a memory (MEM) 17, a serial interface unit (S_IF) 18, and a system bus 19 that connects these units.

Such an imaging apparatus 1 is used as, for example, a portable terminal apparatus, a digital still camera, a digital single lens reflex camera, and a digital video camera.

Figure 2:
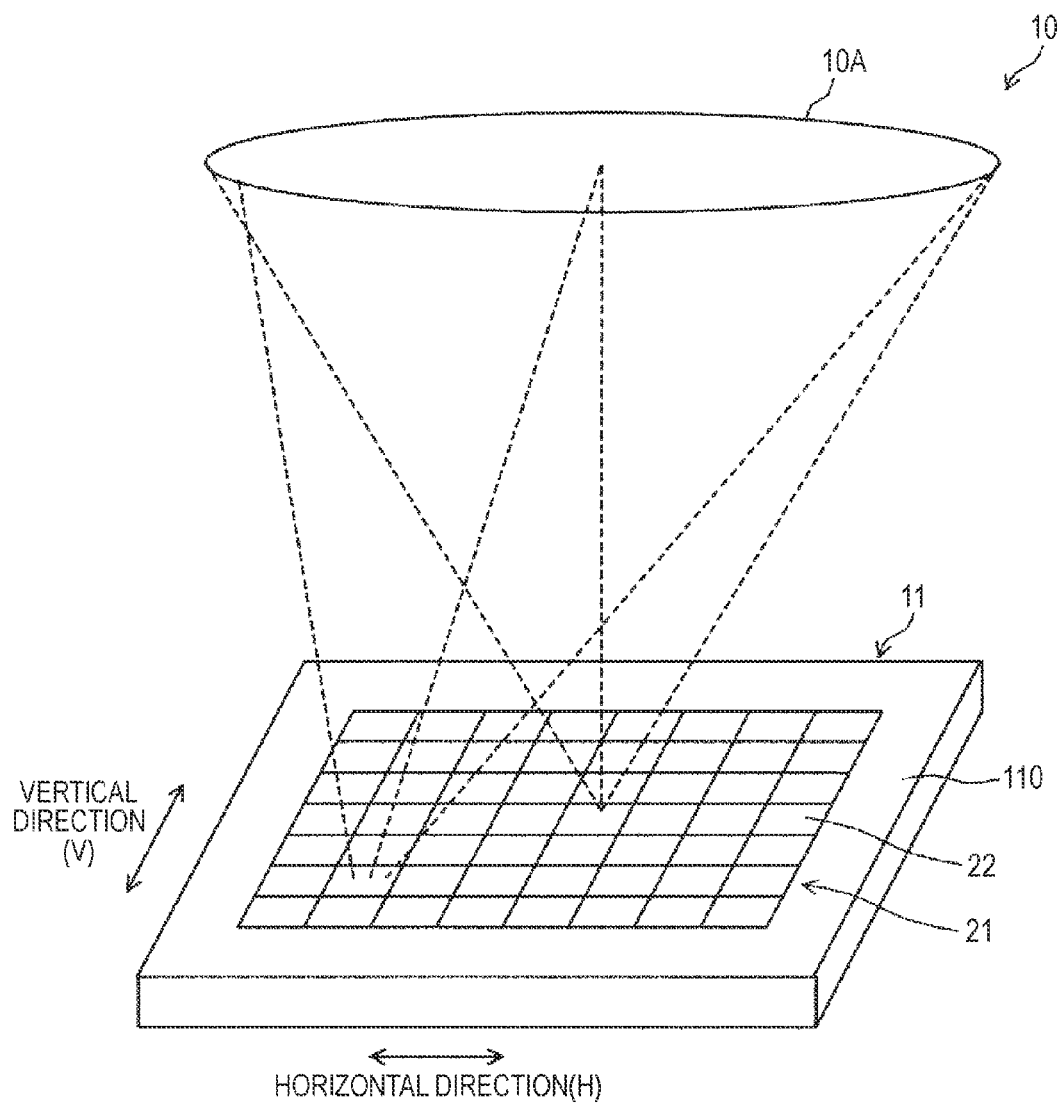
FIG. 2 is a schematic diagram of the optical arrangement of an optical unit and a solid-state imaging device shown in FIG. 1.

FIG. 2 is a schematic diagram for explaining the schematic optical arrangement of the optical unit 10 and the solid-state imaging device 11.

The optical unit 10 includes a condenser lens 10A.

The optical unit 10 condenses light of a subject.

The solid-state imaging device 11 configures a CMOS sensor.

The solid-state imaging device 11 includes a light receiving unit 21 that receives the light of the subject.

Plural pixel circuits 22 are two-dimensionally arrayed in the light receiving unit 21.

The light of the subject is condensed on the light receiving unit 21 by the optical unit 10.

As shown in FIG. 2, an optical axis of the optical unit 10 is set in the center of the light receiving unit 21.

Therefore, the light condensed by the optical unit 10 is made incident on the center of the light receiving unit 21 from a right above direction and is made incident on the peripheral portion of the light receiving unit 21 from an oblique direction.

The solid-state imaging device 11 outputs an output signal including, as serial data, a value of an amount of light received by the plural pixel circuits 22.

The signal processing circuit 12 is, for example, a DSP (Digital Signal Processor).

The signal processing circuit 12 is connected to the solid-state imaging device 11.

The output signal of the solid-state imaging device 11 is input to the signal processing circuit 12.

The signal processing circuit 12 obtains, for example, a full-color image of three colors R, G, and B from the value of the amount of light received by the plural pixel circuits 22 included in the output signal.

Consequently, the signal processing circuit 12 generates an image signal including full-color image data.

The signal processing circuit 12 outputs the generated image signal to the system bus 19.

The operation unit 13 includes plural operation keys.

The operation keys include a power supply key and an imaging key.

The operation unit 13 generates a signal including a value corresponding to an operated key.

The operation unit 13 outputs the generated signal to the CPU 15 through the system bus 19.

The display unit 14 displays an image.

For example, an image signal is input to the display unit 14 from the system bus 19.

The display unit 14 displays an image based on image data included in the input image signal.

A semiconductor memory card (M_CARD) 20 is detachably connected to the serial interface unit 18.

The semiconductor memory card 20 can be, for example, a flash memory.

The serial interface unit 18 accesses the semiconductor memory card 20 inserted therein.

For example, an image signal is input to the serial interface unit 18 from the system bus 19.

The serial interface unit 18 stores image data included in the input image signal in the semiconductor memory card 20.

The memory 17 stores a computer program that the CPU 15 can execute and data generated by the CPU 15 or the like.

An image signal or the like is input to the memory 17 from the system bus 19.

The memory 17 stores image data included in the input image signal.

The computer program stored in the memory 17 may be stored in the memory 17 in advance before the shipment of the imaging apparatus 1 or may be stored in the memory 17 after the shipment.

The computer program stored in the memory 17 after the shipment can be obtained by, for example, installing a computer program stored in a computer-readable recording medium.

The computer program stored in the memory 17 after the shipment may be obtained by installing a computer program downloaded through a transmission medium such as the Internet.

The CPU 15 executes the computer program stored in the memory 17.

Consequently, the control unit (CTRL: controller) 16 is realized in the CPU 15.

The control unit 16 controls the operation of the imaging apparatus 1.

For example, a signal generated when the imaging key is operated from the operation unit 13 is input to the CPU 15.

When the imaging key is depressed, the control unit 16 outputs a start signal for imaging to the solid-state imaging device 11.

When the imaging key changes from a depressed state to a non-depressed state, the control unit 16 outputs an end signal for imaging to the solid-state imaging device 11.

Configuration of the Solid-State Imaging Device

Figure 3:
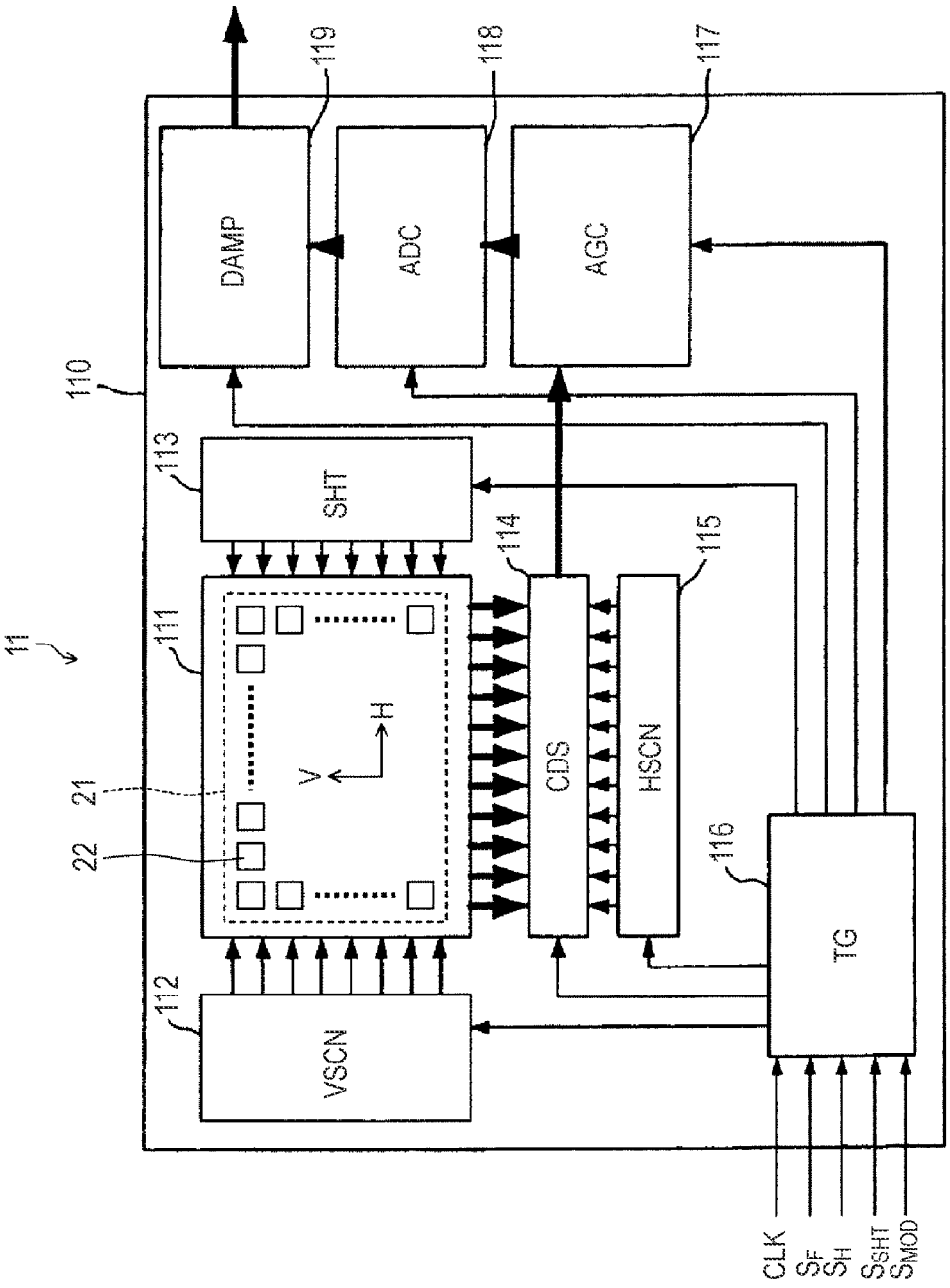
FIG. 3 is a block layout diagram of an example of the solid-state imaging device shown in FIG. 1.

FIG. 3 is a layout diagram of an example of a block layout of the solid-state imaging device 11 shown in FIG. 1.

The solid-state imaging device 11 shown in FIG. 3 is an example of a CMOS image sensor.

The solid-state imaging device 11 can perform, in row units, readout of signals from the plural pixel circuits 22.

In FIG. 3, for convenience of illustration, the sizes of blocks are enlarged or reduced and rendered as appropriate.

The solid-state imaging device 11 includes a semiconductor substrate 110.

On the semiconductor substrate 110, a pixel unit (SNS) 111, a row selection circuit (VSCN) 112, a shutter row selection circuit (SHT) 113, a correlated double sampling circuit (CDS) 114, a column selection circuit (HSCN) 115, and the like are formed.

Further, on the semiconductor substrate 110, an AGC circuit (AGC) 117, an analog-to-digital converter (ADC) 118, a digital amplifier circuit (DAMP) 119, and a timing generator (TG) 116 are formed.

These circuits are connected to one another by, for example, wires formed on the semiconductor substrate 110.

The pixel unit 111 includes the plural pixel circuits 22. The plural pixel circuits 22 are two-dimensionally arrayed on one surface of the semiconductor substrate 110.

A range in which the plural pixel circuits 22 are arrayed is the light receiving unit 21 of the semiconductor substrate 110.

In the following explanation, a left to right direction of the pixel unit 111 in the block diagram of FIG. 3 is referred to as horizontal direction.

An up to down direction of the pixel unit 111 in the block diagram of FIG. 3 is referred to as vertical direction.

The light receiving unit 21 shown in FIG. 3 is a rectangular area in which sides in the horizontal direction are longer than sides in the vertical direction.

Figure 4:
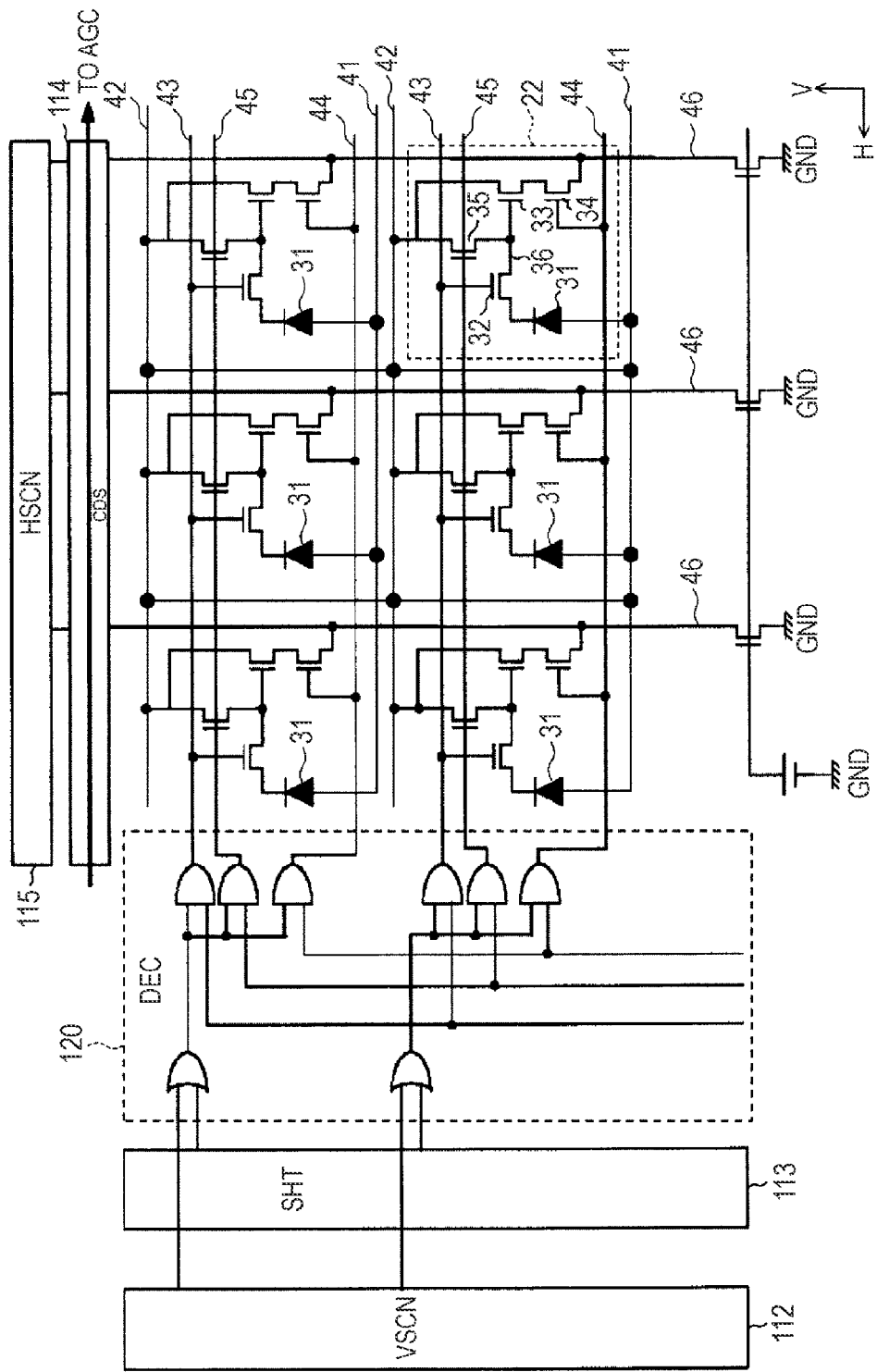
FIG. 4 is a functional block diagram of pixel circuits shown in FIG. 3.

FIG. 4 is a detailed block diagram of the pixel circuits 22.

The block diagram of FIG. 4 is a block diagram of functions of the pixel circuits 22. Actual wiring of the pixel circuits 22 is slightly different from wiring shown in FIG. 4 as partially shown in FIG. 6 referred to later.

In FIG. 4, the plural pixel circuits 22 in 2 rows×3 columns and various peripheral circuits are shown.

Various signal lines and power supply lines are connected to the plural pixel circuits 22.

The various signal lines are connected to the peripheral circuits.

As such various signal lines and power supply lines, for example, there are a ground line 41, a power supply line 42, a transfer signal line 43, a selection signal line 44, and a reset signal line 45, and a pixel output line 46.

In FIG. 4, an area surrounded by square broken lines is one pixel circuit 22.

The plural pixel circuits 22 are two-dimensionally arrayed in the light receiving unit 21 of the semiconductor substrate 110.

Each of the plural pixel circuits 22 includes a photoelectric conversion unit 31, a transfer transistor 32, an amplification transistor 33, a selection transistor 34, and a reset transistor 35.

The photoelectric conversion unit 31 is a photodiode formed on the semiconductor substrate 110.

The photodiode accumulates charges corresponding to an amount of received light.

An anode of the photodiode is connected to the ground line 41.

A cathode of the photodiode is connected to a source electrode of the transfer transistor 32.

Plural photoelectric conversion units 31 are two-dimensionally arrayed in the light receiving unit 21.

The plural photoelectric conversion units 31 are formed at an equal pitch.

Consequently, the plural photoelectric conversion units 31 are uniformly arrayed in the light receiving unit 21.

The transfer transistor 32 is a MOS transistor formed on the semiconductor substrate 110.

A drain electrode of the transfer transistor 32 is connected to a gate electrode of the amplification transistor 33. A source electrode of the transfer transistor 32 is connected to the transfer signal line 43.

A signal line that connects the drain electrode of the transfer transistor 32 and the gate electrode of the amplification transistor 33 is called floating diffusion 36.

When the transfer signal line 43 is at a high level, the transfer transistor 32 forms a channel between the source electrode and the drain electrode.

Consequently, the floating diffusion 36 is connected to the photoelectric conversion unit 31.

The amplification transistor 33 is a MOS transistor formed on the semiconductor substrate 110.

A source electrode of the amplification transistor 33 is connected to the power supply line 42. A drain electrode of the amplification transistor 33 is connected to a source electrode of the selection transistor 34.

The selection transistor 34 is a MOS transistor formed on the semiconductor substrate 110.

A gate electrode of the selection transistor 34 is connected to the selection signal line 44. A drain electrode of the selection transistor 34 is connected to the pixel output line 46.

When the selection signal line 44 is at the high level, the selection transistor 34 is controlled to be on and the amplification transistor 33 is connected to the pixel output line 46.

When the photoelectric conversion unit 31 is connected to the gate electrode of the amplification transistor 33, the pixel output line 46 is set to a voltage level corresponding to an amount of charges accumulated in the photoelectric conversion unit 31.

The reset transistor 35 is a MOS transistor formed on the semiconductor substrate 110.

A gate electrode of the reset transistor 35 is connected to the reset signal line 45. A source electrode of the reset transistor 35 is connected to the power supply line 42. A drain electrode of the reset transistor 35 is connected to the floating diffusion 36.

When the reset signal line 45 is at the high level, the reset transistor 35 connects the floating diffusion 36 to the power supply line 42.

Consequently, the floating diffusion 36 is reset to a power supply voltage level.

As explained above, the pixel circuit 22 is connected to the ground line 41, the power supply line 42, the transfer signal line 43, the selection signal line 44, the reset signal line 45, and the pixel output line 46.

The plural pixel circuits 22 arrayed two-dimensionally are connected to plural ground lines 41, plural power supply lines 42, plural transfer signal lines 43, plural selection signal lines 44, plural reset signal lines 45, and plural pixel output lines 46.

For example, the plural pixel circuits 22 arrayed two-dimensionally are connected to the common transfer signal line 43, selection signal line 44, and reset signal line 45 for each one row.

The plural pixel circuits 22 arrayed two-dimensionally are connected to the common pixel output line 46 for each one column.

The plural power supply lines and the plural signal lines are connected to a decoder (DEC) 120, the correlated double sampling circuit 114, and the like formed around the plural pixel circuits 22. The decoder 120 is connected to the row selection circuit 112 and the shutter row selection circuit 113.

For example, the plural transfer signal lines 43, the plural selection signal lines 44, and the plural reset signal lines 45 are connected to the row selection circuit 112 and the shutter row selection circuit 113 by a predetermined logic circuit.

The row selection circuit 112 and the shutter row selection circuit 113 are arranged on one end side in the horizontal direction of the rectangular light receiving unit 21 long in the horizontal direction.

Therefore, the plural transfer signal lines 43, the plural selection signal lines 44, and the plural reset signal lines 45 traverse the rectangular light receiving unit 21 long in the horizontal direction over the entire width of the light receiving unit 21.

The plural pixel output lines 46 are connected to the correlated double sampling circuit 114.

The correlated double sampling circuit 114 is arranged on one end side in the vertical direction of the light receiving unit 21.

Therefore, the plural pixel output lines 46 traverse longitudinally the rectangular light receiving unit 21 long in the horizontal direction over the entire width of the light receiving unit 21.

Similarly, the plural ground lines 41 and the plural power supply lines 42 are connected to the plural pixel circuits 22. Therefore, as explained later, the plural ground lines 41 and the plural power supply lines 42 traverse longitudinally the rectangular light receiving unit 21 long in the horizontal direction over the entire width of the light receiving unit 21.

Layout of Various Wires and the Photoelectric Conversion Units 31 in the Light Receiving Unit 21

A layout of various wires and the photoelectric conversion units 31 formed in the light receiving unit 21 is explained below.

FIGS. 5A to 5C are schematic partial sectional views of the pixel unit 111 of the solid-state imaging device 11 shown in FIG. 2.

FIG. 5A is a partial sectional view of a center portion of the pixel unit 111.

FIG. 5B is a partial sectional view of an intermediate portion between the center portion and a peripheral portion of the pixel unit 111.

FIG. 5C is a partial sectional view of the peripheral portion of the pixel unit 111.

As shown in FIGS. 5A to 5C, the plural photoelectric conversion units 31 and plural MOS transistors 37 are formed on the semiconductor substrate 110 of the solid-state imaging device 11.

In FIGS. 5A to 5C, the plural photoelectric conversion units 31 are formed to be arranged at equal intervals.

The various MOS transistors 32 to 35 of the pixel circuits 22 are formed among the plural photoelectric conversion units 31.

In FIGS. 5A to 5C, each set of the photoelectric conversion unit 31 and the MOS transistor 37 shown in the figure corresponds to each of the pixel circuits 22. The MOS transistor 37 shown in FIGS. 5A to 5C is, for example, the transfer transistor 32.

An insulating film 71, a color filer array 72, and a lens array 73 are formed in that order on the semiconductor substrate 110 in the light receiving unit 21.

The insulating film 71 is formed of a transparent or a translucent insulative resin material.

A surface layer section on the upper side of the insulating film 71 is planarized by a passivation film.

The color filter array 72 includes plural filter units 72A.

The plural filter units 72A are colored in one color selected out of the three colors R, G, and B.

The filter units 72A are two-dimensionally arrayed in the light receiving unit 21 to correspond to the pixel circuits 22 in a one-to-one relation.

The lens array 73 includes plural lens units 73A.

The lens units 73A have a convex lens shape.

The lens units 73A are two-dimensionally arrayed in the light receiving unit 21 to correspond to the pixel circuits 22 in a one-to-one relation. Therefore, the lens units 73A overlap the filter units 72A, respectively.

Each set of the filter unit 72A and the lens unit 73A is located substantially above each of the pixel circuits 22.

Specifically, as shown in FIG. 5A, in the center portion of the light receiving unit 21, light is made incident on the pixel circuit 22 from right above. Therefore, the filter unit 72A and the lens unit 73A are formed right above the pixel circuit 22.

On the other hand, as shown in FIG. 5C, in the peripheral portion of the light receiving unit 21, light is made incident on the pixel circuit 22 from an oblique direction. Therefore, the filter unit 72A and the lens unit 73A are formed to be shifted in an oblique upward direction of the pixel circuit 22.

As shown in FIGS. 5A to 5C, plural wiring bodies 51 to 53 are formed in three layers in the insulating film 71.

The various signal lines and power supply lines that vertically and horizontally traverse the light receiving unit 21 are formed by the plural wiring bodies 51 to 53.

In FIGS. 5A to 5C, the three wiring layers extend in a direction perpendicular to the paper surface of the figures.

The three wiring layers are electrically connected to one another by via contacts not shown in the figures.

One wiring section 50 is formed by the wiring bodies 51 to 53 in the three layers.

The wiring section 50 is used as, for example, the ground line 41, the power supply line 42, the transfer signal line 43, the selection signal line 44, the reset signal line 45, and the pixel output line 46.

Plural wiring sections 50 shown in FIGS. 5A to 5C extend along one direction (a direction perpendicular to the paper surface) of arraying directions of the photoelectric conversion units 31.

As explained later, in the plural wiring sections 50 shown in FIGS. 5A to 5C, amounts of shift of respective intermediate wiring bodies 52 with respect to respective bottom wiring bodies 51 are the same in the one arraying direction (both the amounts of shift are zero).

The intermediate wiring bodies 52 in the other arraying direction (a direction in the paper surface of FIGS. 5A to 5C) of the two-dimensional arraying directions are superimposed while being shifted from positions right above the bottom wiring bodies 51.

The plural top wiring bodies 53 are also superimposed while being shifted from the positions right above the bottom wiring bodies 51.

For example, as shown in FIG. 5A, the wiring sections 50 are formed between adjacent two photoelectric conversion units 31 to avoid a light incident path extending from the filter unit 72A and the lens unit 73A to the photoelectric conversion unit 31 of the pixel circuit 22.

Specifically, for example, in the center portion of the light receiving unit 21 shown in FIG. 5A, the intermediate wiring bodies 52 and the top wiring bodies 53 are superimposed in positions right above the bottom wiring bodies 51.

In the intermediate portion of the light receiving unit 21 shown in FIG. 5B, for example, the intermediate wiring bodies 52 and the top wiring bodies 53 are superimposed while being slightly shifted to the center from the positions right above the bottom wiring bodies 51.

In the peripheral portion of the light receiving unit 21 shown in FIG. 5C, for example, the intermediate wiring bodies 52 and the top wiring bodies 53 are superimposed while being shifted to the center from the positions right above the bottom wiring bodies 51.

An amount of shift in the center direction in the peripheral portion is larger than an amount of shift in the center direction in the intermediate portion.

Explanation of a Dummy Wiring Body 62

Figure 6:
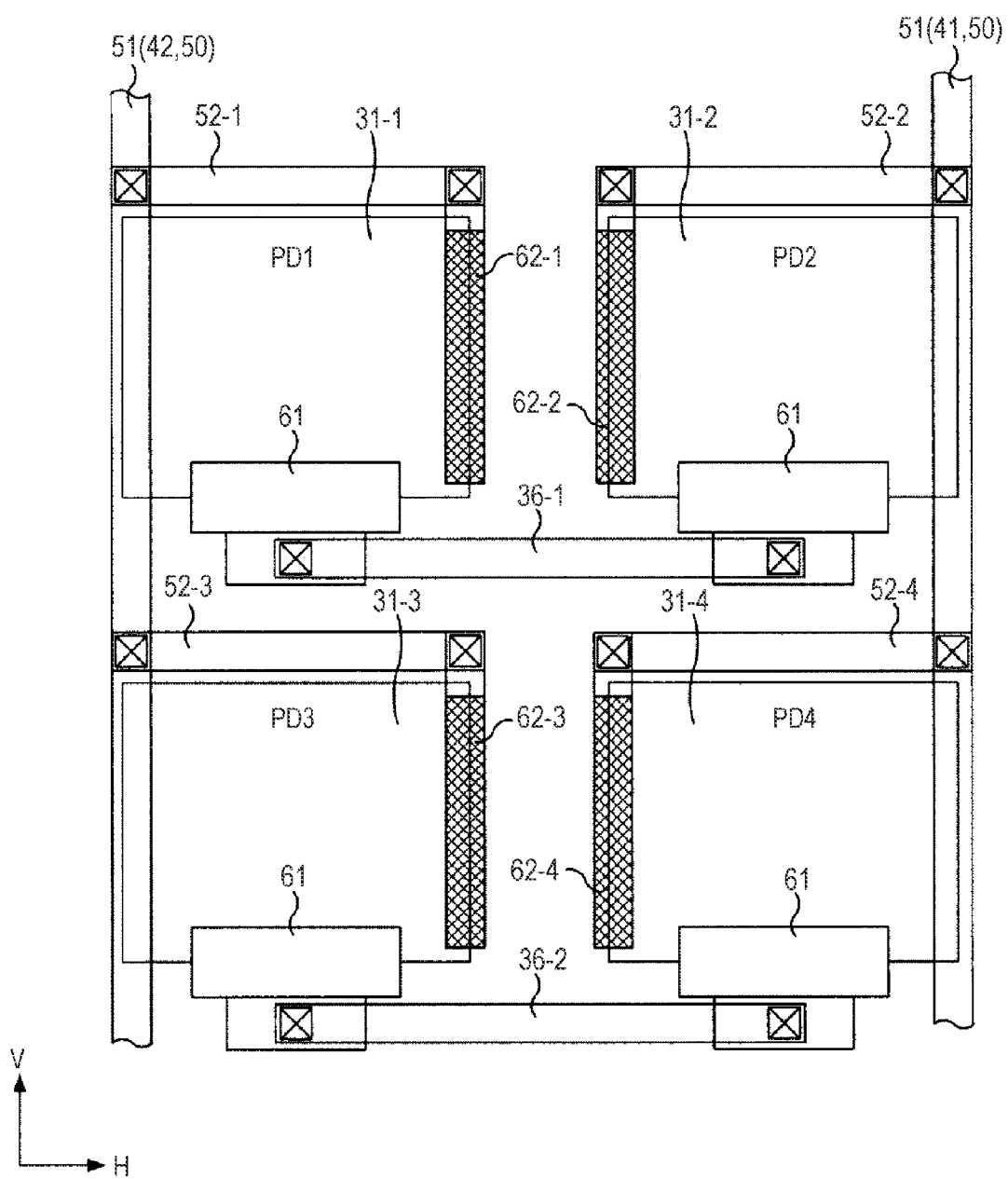
FIG. 6 is a partial plan view in an actual layout of photoelectric conversion units and wiring sections in the first embodiment.

FIG. 6 is a partial plan view of one set of the photoelectric conversion units 31 and the wiring sections 50 around the photoelectric conversion units 31.

FIG. 6 is a diagram of the light receiving unit 21 viewed from a light incident direction.

The photoelectric conversion units 31 shown in FIG. 6 have substantially square light receiving areas.

The light receiving areas of the plural photoelectric conversion units 31 are arrayed at an equal pitch.

In FIG. 6, gate electrodes 61 of two photoelectric conversion units 31 arranged side by side are connected to one floating diffusion 36 in common.

A wiring body extending vertically on the right side of FIG. 6 is the bottom wiring body 51 of the power supply line 42.

A wiring body extending vertically on the left side of FIG. 6 is the bottom wiring body 51 of the ground line 41.

In this way, the floating diffusion 36, the power supply line 42, and the ground line 41 are provided in a unit of the photoelectric conversion units 31 in two columns.

Therefore, the plural photoelectric conversion units 31 two-dimensionally arrayed at an equal pitch in the light receiving unit 21 are uniformly arrayed in the light receiving unit 21.

On the other hand, the floating diffusion 36, the power supply line 42, and the ground line 41 are non-uniformly arrayed in the light receiving unit 21.

For example, when light is made incident obliquely from the left side in FIG. 6, in the photoelectric conversion units 31 on the left side in FIG. 6, a part of the incident light is blocked by the power supply line 42.

On the other hand, in the photoelectric conversion units 31 on the right side in FIG. 6, the incident light is made incident without being blocked.

Therefore, even if the photoelectric conversion units 31 on the left side and the photoelectric conversion units 31 on the right side in FIG. 6 have the same photoelectric conversion characteristics, the sensitivity of the photoelectric conversion units 31 on the left side is low compared with the photoelectric conversion units 31 on the right side.

Therefore, in this embodiment, plural dummy wiring bodies 62 are provided on the light receiving unit 21.

The dummy wiring bodies 62 are wiring sections that do not function as wiring sections for connecting the photoelectric conversion units 31 and the peripheral circuits.

Specifically, in a first photoelectric conversion unit 31-1 on the upper left in FIG. 6, since the power supply line 42 overlaps the left side portion, a first dummy wiring body 62-1 is formed to be superimposed on the right side portion.

Consequently, in the first photoelectric conversion unit 31-1, a pair of wiring sections are formed to be superimposed on both end sides in the horizontal direction thereof.

The pair of wiring sections are arranged in positions optically symmetrical with respect to the center of the first photoelectric conversion unit 31-1.

In a second photoelectric conversion unit 31-2 on the upper right in FIG. 6, since the ground line 41 overlaps the right side portion, a second dummy wiring body 62-2 is formed to be superimposed on the left side portion.

Consequently, in the second photoelectric conversion unit 31-2, a pair of wiring sections are formed to be superimposed on both end sides in the horizontal direction thereof.

The pair of wiring sections are arranged in positions optically symmetrical with respect to the center of the second photoelectric conversion unit 31-2.

In a third photoelectric conversion unit 31-3 on the lower left in FIG. 6, since the power supply line 42 overlaps the left side portion, a third dummy wiring body 62-3 is formed to be superimposed on the right side portion.

Consequently, in the third photoelectric conversion unit 31-3, a pair of wiring sections are formed to be superimposed on both end sides in the horizontal direction thereof.

The pair of wiring sections are arranged in positions optically symmetrical with respect to the center of the third photoelectric conversion unit 31-3.

In a fourth photoelectric conversion unit 31-4 on the lower right in FIG. 6, since the ground line 41 overlaps the right side portion, a fourth dummy wiring body 62-4 is formed to be superimposed on the left side portion.

Consequently, in the fourth photoelectric conversion unit 31-4, a pair of wiring sections are formed to be superimposed on both end sides in the horizontal direction thereof.

The pair of wiring sections are arranged in positions optically symmetrical with respect to the center of the fourth photoelectric conversion unit 31-4.

In the first embodiment, the plural dummy wiring bodies 62 are connected to the power supply line 42 or the ground line 41 to apply potential to the plural dummy wiring bodies 62.

Specifically, the first dummy wiring body 62-1 on the upper left in FIG. 6 is electrically connected to the bottom wiring body 51 of the power supply line 42 by a first intermediate wiring body 52-1.

The second dummy wiring body 62-2 on the upper right in FIG. 6 is electrically connected to the bottom wiring body 51 of the ground line 41 by a second intermediate wiring body 52-2.

The third dummy wiring body 62-3 on the lower left in FIG. 6 is electrically connected to the bottom wiring body 51 of the power supply line 42 by a third intermediate wiring body 52-3.

The fourth dummy wiring body 62-4 on the lower right in FIG. 6 is electrically connected to the bottom wiring body 51 of the ground line 41 by a fourth intermediate wiring body 52-4.

In this way, the dummy wiring bodies 62 are connected to the power supply line 42 or the ground line 41 in one place.

Therefore, the dummy wiring bodies 62 do not function as the power supply line 42 or the ground line 41 even if potential is applied to the dummy wiring bodies 62.

Operation of the Imaging Apparatus 1

The operation of the imaging apparatus 1 shown in FIG. 1 is explained below.

In the following explanation, operation in the case of long-time exposure by pressing a shutter for several tens seconds or pressing a valve shutter is explained as an example.

Figure 7:
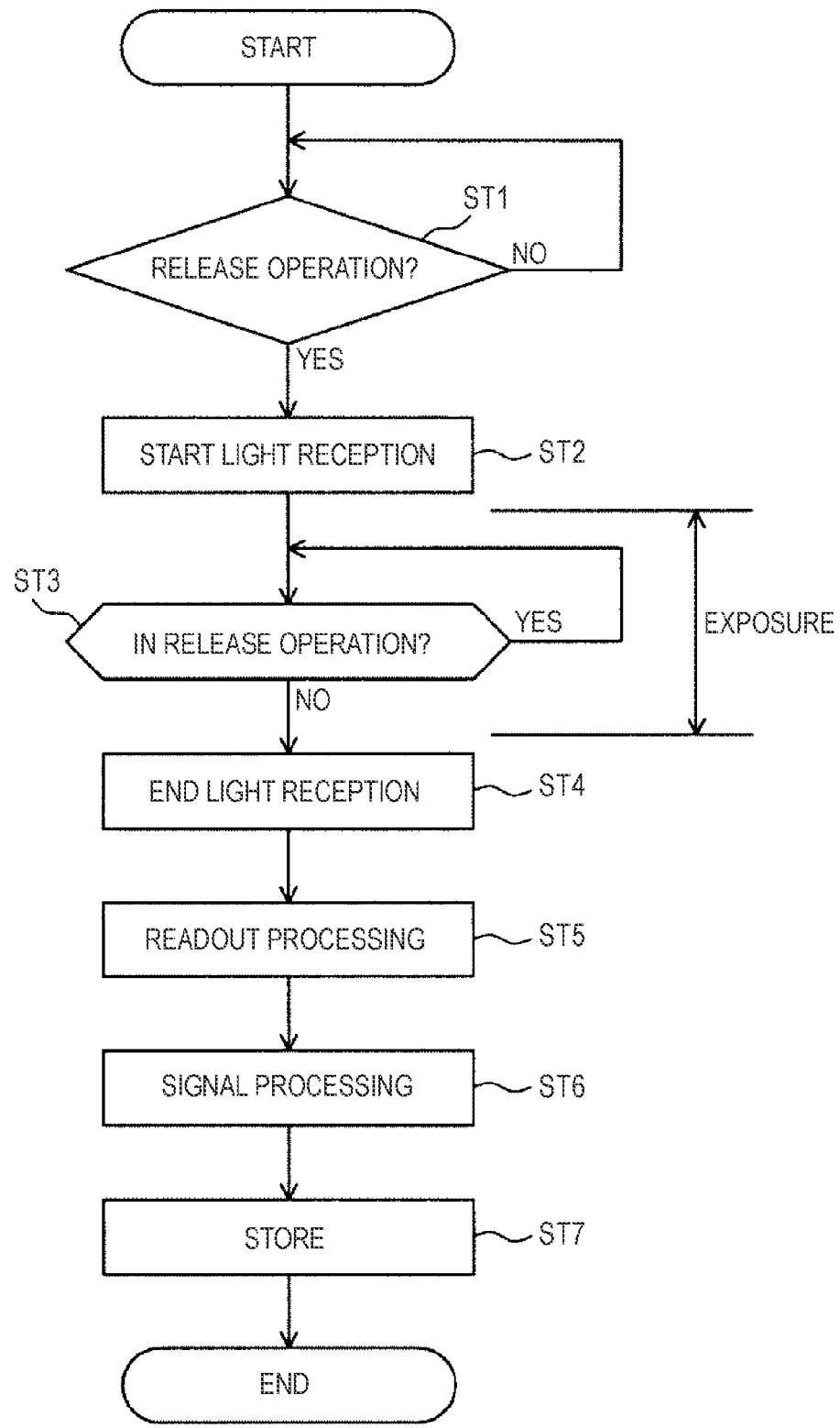
FIG. 7 is a flowchart of long-time exposure processing in the imaging apparatus shown in FIG. 1.

FIG. 7 is a flowchart of long-time exposure processing in the imaging apparatus 1 shown in FIG. 1.

In the operation of the long-time exposure, when the imaging key is depressed in the operation unit 13, the control unit 16 determines that release operation is performed (step ST1).

The control unit 16 outputs a start signal for imaging to the solid-state imaging device 11.

According to the start signal, the solid-state imaging device 11 starts imaging processing (step ST2).

The solid-state imaging device 11 resets the plural photoelectric conversion units 31. The solid-state imaging device 11 causes the plural photoelectric conversion units 31 after the reset to receive light.

After instructing the solid-state imaging device 11 to start imaging, the control unit 16 monitors the imaging key.

The control unit 16 repeatedly determines whether the imaging key is in a depressed state (step ST3).

When the imaging key is in the depressed state, the control unit 16 determines that the release operation is being performed.

When, for example, an exposure period of several seconds to several minutes elapses and the imaging key is not depressed any more, the control unit 16 determines that the release operation is ended.

The control unit 16 outputs an end signal for imaging to the solid-state imaging device 11.

When the end signal for imaging is input, the solid-state imaging device 11 ends the light reception (step ST4).

The solid-state imaging device 11 starts readout processing (step ST5).

In the readout processing, the solid-state imaging device 11 causes, for example, by using the line selection circuit 112 and the shutter row selection circuit 113, the plural pixel circuits 22 to operate row by row.

The row selection circuit 112 and the shutter row selection circuit 113 control, for example, the transfer signal lines 43 and the selection signal lines 44 in plural rows to change from a low level to a high level in order row by row.

Consequently, the plural pixel output lines 46 are controlled by the pixel circuit 22 in a controlled row to change to a level corresponding to an amount of received light of the photoelectric conversion unit 31 in the row.

The correlated double sampling circuit 114 generates, in order row by row, signals corresponding to amounts of received light of the plural pixel circuits 22 on the basis of a correlation between an output level of the pixel circuits 22 during reset measured in advance and an output level of the pixel circuits 22 read out during imaging.

The correlated double sampling circuit 114 outputs the signals of the amounts of the received light of the plural pixel circuits 22 in order row by row in synchronization with a synchronization signal from the row selection circuit 112.

The AGC circuit 117 amplifies the signals of the amounts of the received light.

The analog-to-digital converter 118 samples the signals of the amounts of the received light and obtains data of the amounts of the received light of the plural pixel circuits 22.

The digital amplifier circuit 119 generates an output signal including the data of the amounts of the received light of the plural pixel circuits 22 in the order of the read-out rows.

A series of operation of these circuits is executed in synchronization with a synchronization signal from the timing generator 116.

According to the readout processing, the solid-state imaging device 11 outputs, to the signal processing circuit 12, an output signal including the values of the amounts of the received light of the plural pixel circuits 22 (the photoelectric conversion units 31) two-dimensionally arrayed in the light receiving unit 21.

The signal processing circuit 12 generates full-color image data of R, G, and B from the output signal of the solid-state imaging device 11 (step ST6).

The signal processing circuit 12 outputs, for example, an image signal including the full-color image data to the system bus 19.

When the image signal is output to the system bus 19, the memory 17 captures the image signal and stores the image data included in the image signal.

The serial interface unit 18 captures the image signal output to the system bus 19 and stores the image data included in the image signal in the semiconductor memory card 20.

The display unit 14 captures the image signal output to the system bus 19 and displays an image of the image data included in the image signal.

Consequently, the image picked up by the imaging apparatus 1 is stored in the semiconductor memory card 20 or the like (step ST7).

A user can check, according to the display on the display unit 14, the image picked up by the imaging apparatus 1.

As explained above, in the solid-state imaging device 11 according to the first embodiment, in order to perform optical correction, in the photoelectric conversion units 31, the dummy wiring bodies 62 are provided in the positions optically symmetrical to the wiring sections 50.

Therefore, lights made incident on the photoelectric conversion units 31 are optically symmetrical lights.

Amounts of received light of the plural photoelectric conversion units 31 are made uniform.

Photoelectric conversion characteristics of the plural photoelectric conversion units 31 are improved to uniform characteristics.

In the solid-state imaging device 11 according to the first embodiment, the dummy wiring bodies 62 are connected to the power supply line 42 or the ground line 41.

Specifically, the dummy wiring bodies 62 formed in positions on the opposite side symmetrical to the power supply line 42 with respect to the photoelectric conversion units 31 are connected to the power supply line 42.

The dummy wiring bodies 62 formed in positions on the opposite side symmetrical to the ground line 41 with respect to the photoelectric conversion units 31 are connected to the ground line 41.

Therefore, the potentials of the dummy wiring bodies 62 are stabilized at a ground potential or a power supply potential. Light is received in a state in which the potential is applied to the dummy wiring bodies 62.

Therefore, a dark signal component by the dummy wiring bodies 62 is equivalent to a dark signal component by the ground line 41 or the power supply line 42.

A degree of the actual influence of the dummy wiring bodies 62 on the photoelectric conversion characteristics of the photoelectric conversion units 31 is suppressed.

Therefore, in the first embodiment, for example, it is possible to suppress an increase in the dark signal component by the dummy wiring bodies 62.

In the first embodiment, an image defect such as white void less easily occurs in a picked-up image.

In the first embodiment, it is possible to suppress unevenness of coloring in an image.

In the first embodiment, it is possible to predict that a degree of the actual influence of the dummy wiring bodies 62 on the photoelectric conversion characteristics of the photoelectric conversion units 31 is the same as a degree of the actual influence of the ground line 41 or the power supply line 42 on the photoelectric conversion characteristics.

Unlike this embodiment, when potential is not applied to the dummy wiring bodies 62, in some case, the potentials of the dummy wiring bodies 62 are substantially different from the potentials of the other wiring sections 50.

The influence of this potential difference on the characteristic of the photoelectric conversion units 31 is larger.

In the first embodiment, since such a potential difference could not occur, it is possible to suppress the influence on the characteristic of the photoelectric conversion units 31.

In the first embodiment, as shown in FIG. 6, the plural dummy wiring bodies 62 for the plural photoelectric conversion units 31 arranged in the column direction along the power supply line 42 are connected to the power supply line 42 in common.

Therefore, in the first embodiment, it is possible to make characteristic differences of the photoelectric conversion characteristics of the plural photoelectric conversion units 31 arranged in the column direction along the power supply line 42 uniform.

The plural dummy wiring bodies 62 for the plural photoelectric conversion units 31 arranged in the column direction along the ground line 41 are connected to the ground line 41 in common.

Therefore, in the first embodiment, it is possible to make characteristic differences of the photoelectric conversion characteristics of the plural photoelectric conversion units 31 arranged in the column direction along the ground line 41 uniform.

In the first embodiment, it is possible to suppress, for example, a difference in coloring for each of pixels due to signal processing that is anticipated when the potentials of the dummy wiring bodies 62 are unstable.

In some case, the difference in coloring for each of pixels due to the signal processing occurs during long-time charge accumulation in, for example, pressing a shutter for several tens seconds or pressing a valve shutter of a single lens reflex camera.

In the first embodiment, deterioration in an image quality that occurs when the potentials of the dummy wiring bodies 62 are unstable is suppressed. Therefore, in the imaging apparatus 1 according to the first embodiment, it is unnecessary to implement a new computer program for suppressing such deterioration in an image quality.

Second Embodiment

Figure 8:
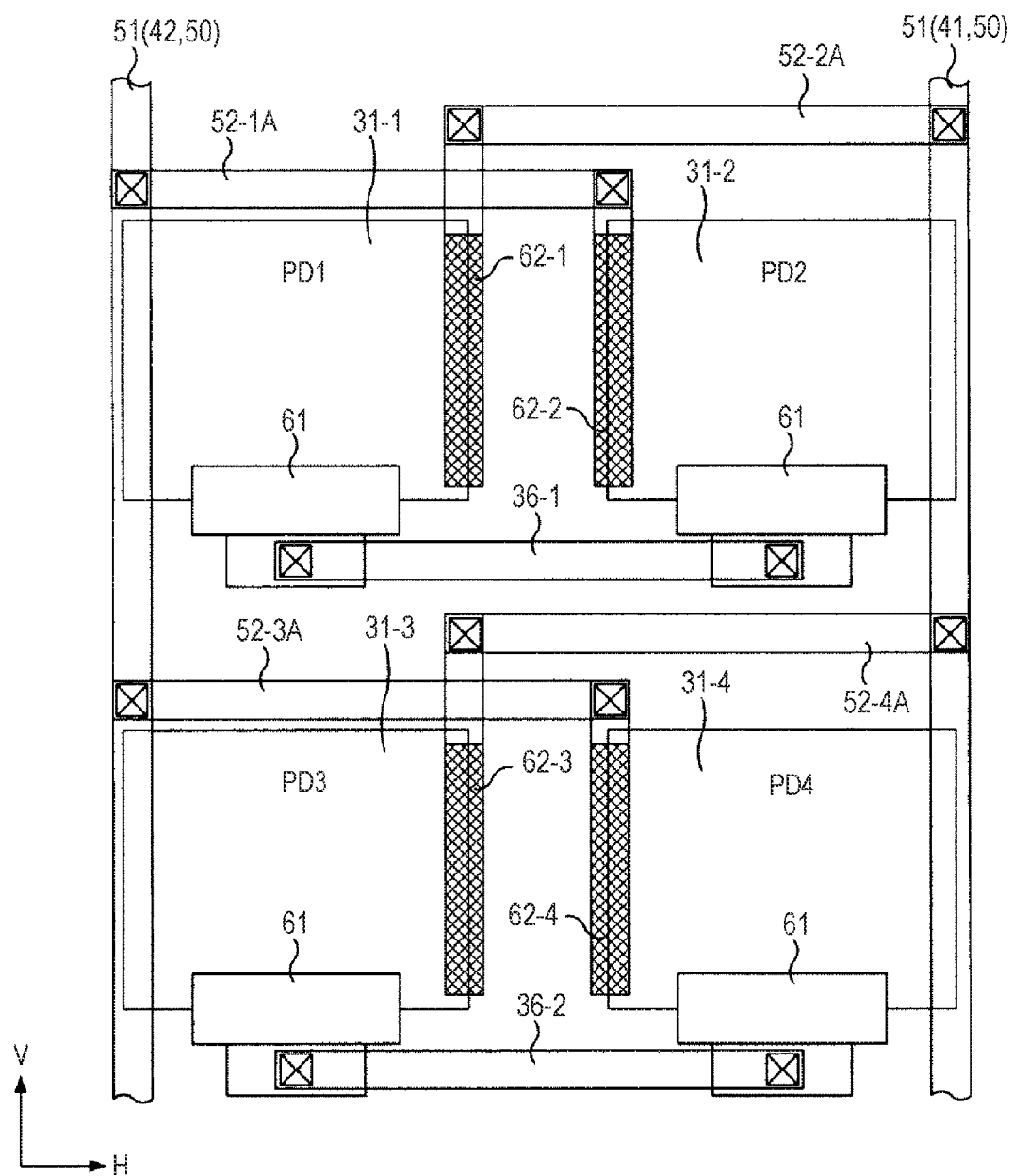
FIG. 8 is a partial plan view in an actual layout of photoelectric conversion units and wiring sections in a second embodiment of the present invention.

FIG. 8 is a partial plan view of one set of photoelectric conversion units 31 and the wiring sections 50 around the photoelectric conversion units 31 according to a second embodiment of the present invention.

Components of the imaging apparatus 1 according to the second embodiment are the same as those of the imaging apparatus 1 according to the first embodiment except components shown in FIG. 8.

In FIG. 8, the first dummy wiring body 62-1 on the upper left is electrically connected to the bottom wiring body 51 of the ground line 41 by a first intermediate wiring body 52-1A.

Consequently, the bottom wiring body 51 of the power supply line 42 overlaps the left end side of the first photoelectric conversion unit 31-1 on the upper left in FIG. 8.

The bottom wiring body 51 of the ground line 41 overlaps the right end side of the first photoelectric conversion unit 31-1.

The second dummy wiring body 62-2 on the upper right in FIG. 8 is electrically connected to the bottom wiring body 51 of the power supply line 42 by a second intermediate wiring body 52-2A.

Consequently, the bottom wiring body 51 of the power supply line 42 overlaps the left end side of the second photoelectric conversion unit 31-2 on the upper right in FIG. 8.

The bottom wiring body 51 of the ground line 41 overlaps the right end side of the first photoelectric conversion unit 31-1.

Similarly, the third dummy wiring body 62-3 on the lower left in FIG. 6 is electrically connected to the bottom wiring body 51 of the ground line 41 by a third intermediate wiring body 52-3A.

The fourth dummy wiring body 62-4 on the lower right in FIG. 6 is electrically connected to the bottom wiring body 51 of the power supply line 42 by a fourth intermediate wiring body 52-4A.

In this way, in the second embodiment, the wiring bodies having the power supply potential overlap the left end sides of the photoelectric conversion units 31.

The wiring bodies having the ground potential overlap the right end sides of the photoelectric conversion units 31.

Therefore, in the second embodiment, irrespectively of the fact that the plural wiring sections 50 are non-uniformly arrayed in the light receiving unit 21, it is possible to make the potentials of the wiring sections for the plural photoelectric conversion units 31 uniform.

Specifically, in the second embodiment, the wiring bodies having the power supply potential and the wiring bodies having the ground potential can be arranged in the same manner for the plural photoelectric conversion units 31.

Therefore, in the second embodiment, it is possible to make the characteristics of the plural photoelectric conversion units 31 uniform to intrinsic characteristics of the plural photoelectric conversion units 31.

In the second embodiment, it is possible to suppress fluctuation in the characteristics of the plural photoelectric conversion units 31 due to the wiring bodies having the power supply potential and the wiring bodies having the ground potential.

The embodiments explained above are preferred embodiments of the present invention. However, the present invention is not limited to the embodiments. In the present invention, the embodiments can be variously modified or changed without departing from the spirit of the invention.

In the embodiments, the potential of the dummy wiring section (the dummy wiring body 62) for obtaining optical symmetry is fixed to the power supply potential or the ground potential.

Besides, for example, the potential of the dummy wiring section may be fixed to potential close to the power supply potential or the ground potential.

The potential of the dummy wiring section may be set to potential same as that of the signal lines around the dummy wiring section.

Further, besides, for example, the potential of the dummy wiring section may be controlled to an arbitrary potential.

For example, the potentials of the plural dummy wiring sections can also be individually controlled to arbitrary potentials to offset or reduce characteristic differences of the plural pixel circuits 22 that occur because of structures other than the dummy wiring sections.

Consequently, it is possible to make the characteristics of the plural pixel circuits 22 uniform.

The potential of the dummy wiring section may be controlled to dynamically change according to a state of the solid-state imaging device 11.

In the embodiments, the plural pixel circuits 22 use the floating diffusion 36 in common.

Besides, for example, adjacent two pixel circuits 22 among the plural pixel circuits 22 may share the amplification transistor 33, the selection transistor 34, and the reset transistor 35.

Further, besides, for example, the plural pixel circuits 22 may be formed as circuits independent from one another.

In the embodiments, the dummy wiring section is formed by the dummy wiring body 62 in one layer.

Besides, for example, the dummy wiring section may be formed by laminated plural dummy wiring bodies.

In the embodiments, the wiring sections 50 are formed in the solid-state imaging device 11 including the CMOS sensor.

Besides, for example, the wiring sections 50 and the dummy wiring section may be formed in the solid-state imaging device 11 including a CCD (Charge Coupled Device) sensor.

In the embodiments, the ground potential and power supply potential VDD are fed to the pixel circuits 22 by the ground line 41 and the power supply line 42.

Besides, for example, the ground potential and substrate potential VSS may be fed to the pixel circuits 22.

The present application contains subject matter related to that disclosed in Japanese Priority Patent Application JP 2009-105821 filed in the Japan Patent Office on Apr. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor substrate;
   a light receiving unit having at least one set of photoelectric conversion units, each set comprising plural photoelectric conversion units formed side by side in a first direction on the semiconductor substrate;
   a peripheral circuit outside of the light receiving unit on the semiconductor substrate;
   a wiring section, the wiring section comprising a wiring structure per photoelectric conversion unit, each wiring structure at one side in the first direction of its respective photoelectric conversion unit; and
   a dummy wiring section, the dummy wiring section comprising a dummy wiring structure per photoelectric conversion unit, each dummy wiring structure at an opposite side in the first direction of its respective photoelectric conversion unit,
   wherein,
      each wiring structure and each dummy wiring structure of at least one set extend in a second direction orthogonal to the first direction,
      in operation, the dummy wiring section has a predetermined potential, and
      no dummy wiring structure is electrically connected to a photoelectric conversion unit or the peripheral circuit.

2. A solid-state imaging device according to claim 1, wherein each dummy wiring structure of the least one set is at a position optically symmetrical with respect to the wiring structure and its respective photoelectric conversion unit.

3. A solid-state imaging device according to claim 1, wherein:
   the solid-state imaging device includes a plurality of the wiring sections and a plurality of the dummy wiring sections,
   the plural photoelectric conversion units are uniformly arrayed at an equal pitch in the light receiving unit,
   the plural wiring sections are non-uniformly arrayed in the light receiving unit,
   the plural dummy wiring sections are uniformly arrayed in the light receiving unit, and
   for each photoelectric conversion unit of the at least one set, the wiring structure and the dummy wiring structure are optically symmetrically arranged with respect to the photoelectric conversion unit.

4. A solid-state imaging device according to claim 1, wherein:
   for each set, the wiring section includes a floating diffusion region used in common by the plural photoelectric conversion units of the set,
   the floating diffusion region extends in the first direction, and
   for each photoelectric conversion unit of the at least one set, the dummy wiring structure is at a position optically symmetrical to the wiring structure.

5. A solid-state imaging device according to claim 1, wherein for each photoelectric conversion unit, a predetermined potential of the dummy wiring structure is a potential that is the same as that of the wiring structure.

6. A solid-state imaging device according to claim 5, wherein, for each photoelectric conversion unit:
   the photoelectric conversion unit is formed as a substantially square area, the wiring structure is superimposed on one side of the square area and supplies power to the photoelectric conversion unit, the dummy wiring structure is superimposed on another side of the square area opposite the one side on which the wiring structure is superimposed, and the dummy wiring structure is electrically connected to the wiring structure.

7. The solid-state imaging device according to claim 1, wherein for each photoelectric conversion unit, a predetermined potential of the dummy wiring structure is a potential that is different than that of the wiring structure.

8. The solid-state imaging device according to claim 1, wherein for each photoelectric conversion unit, the dummy wiring structure is connected to the wiring structure but is not connected to the photoelectric conversion unit or the peripheral circuit.

9. An imaging apparatus comprising:

an optical unit that condenses light; and a solid-state imaging device that receives the light condensed by the optical unit, wherein the solid-state imaging device includes (a) a semiconductor substrate; (b) a light receiving unit having at least set of photoelectric conversion units, each set comprising plural photoelectric conversion units formed side by side in a first direction on the semiconductor substrate, the photoelectric conversion units arranged in at least one set; (c) a peripheral circuit outside of the light receiving unit on the semiconductor substrate; fd) a wiring section, the wiring section comprising a wiring structure per photoelectric conversion unit, each wiring structure at one side in the first direction of its respective photoelectric conversion unit; and (e) a dummy wiring section, the dummy wiring section comprising a dummy wiring structure per photoelectric conversion unit, each dummy wiring structure at an opposite side in the first direction of its respective photoelectric conversion unit, each wiring structure and each dummy wiring structure of at least one set extend in a second direction orthogonal to the first direction, in operation, the dummy wiring section is at a predetermined potential, and no dummy wiring structure is electrically connected to a photoelectric conversion unit or the peripheral circuit.

10. An imaging apparatus according to claim 9, wherein:

the solid-state imaging device outputs an output signal corresponding to light received by the plural photoelectric conversion units, the imaging apparatus further comprises:

a signal processing circuit that processes the output signal of the solid-state imaging device and generates data of a picked-up image; and a control unit that controls time for charge accumulation by the plural photoelectric conversion units, and the control unit causes the plural photoelectric conversion units to accumulate charges over several sections or more.

11. A method of driving a solid-state imaging device, comprising the steps of:

receiving light using a solid-state imaging device including (a) a semiconductor substrate; (b) a light receiving unit having at least one set of photoelectric conversion units, each set comprising plural photoelectric conversion units formed side by side in a first direction on the semiconductor substrate, the photoelectric conversion units arranged in at least one set; (c) a peripheral circuit outside of the light receiving unit on the semiconductor substrate; (d) a wiring section, the wiring section comprising a wiring structure per photoelectric conversion unit, each wiring structure at one side in the first direction of its respective photoelectric conversion unit; and (e) a dummy wiring section, the dummy wiring section comprising a dummy wiring structure per photoelectric conversion unit, each dummy wiring structure at an opposite side in the first direction of its respective photoelectric conversion unit, no dummy wiring structure being electrically connected to a photoelectric conversion unit or the peripheral circuit, each wiring structure and each dummy wiring structure of at least one set extend in a second direction orthogonal to the first direction,; and generating an output signal corresponding to light received by the plural photoelectric conversion units of the solid-state imaging device, wherein in the light receiving step, the light is received in a state in which the wiring section and the dummy wiring section are each at a predetermined potential.

* * * * *